United States Patent
Nishimura

(10) Patent No.: US 7,800,440 B2
(45) Date of Patent: Sep. 21, 2010

(54) VARIABLE AUTOMATIC LIMIT CONTROL (ALC) THRESHOLD FOR ANY DESIRED COMPRESSION CURVE

(75) Inventor: Naoaki Nishimura, Funabashi (JP)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/201,409

(22) Filed: Aug. 29, 2008

(65) Prior Publication Data

US 2009/0058519 A1 Mar. 5, 2009

Related U.S. Application Data

(60) Provisional application No. 60/969,523, filed on Aug. 31, 2007, provisional application No. 60/970,283, filed on Sep. 6, 2007.

(51) Int. Cl.
*H03G 3/30* (2006.01)

(52) U.S. Cl. ........................................ 330/85; 330/278

(58) Field of Classification Search ................. 330/129, 330/278–279, 85, 291; 455/126, 127.2
See application file for complete search history.

(56) References Cited

U.S. PATENT DOCUMENTS

| 4,035,739 A | 7/1977 | Dickopp et al. ............. 330/129 |
| 5,631,968 A | 5/1997 | Frey et al. .................... 381/106 |
| 6,038,432 A * | 3/2000 | Onoda ...................... 455/127.2 |
| 7,411,456 B2 * | 8/2008 | Ishida ......................... 330/279 |
| 2006/0008096 A1 | 1/2006 | Waller ........................ 381/106 |

FOREIGN PATENT DOCUMENTS

GB 1342383 A 1/1974

OTHER PUBLICATIONS

YDA144 Detailed Product Data Sheet, Yamaha, 2006.
YDA144 Product Data Sheet, Yamaha, 2005.
MAX9756/MAX9757/MAX9758 Product data sheet, Maxim Integrated Products, Jan. 2006.
Application Note 3877: ALC Improves Sound Quality While Protecting Speakers, Maxim Integrated Products, Aug. 21, 2006.

(Continued)

*Primary Examiner*—Robert Pascal
*Assistant Examiner*—Hieu P Nguyen
(74) *Attorney, Agent, or Firm*—Sunstein Kann Murphy & Timbers LLP

(57) ABSTRACT

A signal conditioning circuit dynamically adjusts a compression ratio, so as to compress a signal and avoid limiting to the extent possible, thereby avoiding distorting the signal by clipping. An input signal is applied to the input of a programmed gain amplifier (PGA) or other amplifier whose gain can be controlled by a gain control signal. The input or the output of the PGA is sampled by a level detector to produce a level signal that represents the level of the signal. A variable source produces a variable threshold signal. A comparator compares the level signal to the variable threshold signal to produce a difference signal. Control logic generates the gain control signal from the difference signal. When the level signal exceeds the threshold signal, the control logic alters the gain control signal to reduce the gain of the PGA, and when the level signal is less than the threshold signal, the control logic alters the gain control signal to increase the gain of the PGA. The threshold signal varies as a function of the gain control signal.

17 Claims, 7 Drawing Sheets

OTHER PUBLICATIONS

Gaalaas, Eric, Class D Audio Amplifiers: What, Why, and How, Analog Devices, Inc., 2006.
Li, Alan, Versatile Programmable Amplifiers Use Digital Potentiometyers with Nonvolatile Memory, Analog Devices, Inc., 2001.
SSM2120 Product Data Sheet, Analog Devices, Inc., 1995.
SSM2317 product information web page 1, Analog Devices, Inc., Jul. 28, 2008.
SSM2317 product data sheet, Analog Devices, Inc., Mar. 2008.
*Notification of Transmittal of the International Search Report* International Application No. PCT/US2008/074775, Oct. 29, 2008, 3 pages.
*The International Search Report and the Written Opinion of the International Searching Authority*, International Application No. PCT/US2008/074775, International Searching Authority, Oct. 29, 2008, 33 pages.

* cited by examiner

VARIABLE AUTOMATIC LIMIT CONTROL (ALC) THRESHOLD FOR ANY DESIRED COMPRESSION CURVE

CROSS REFERENCE TO RELATED APPLICATIONS

This application claims the benefit of U.S. Provisional Patent Application No. 60/969,523, filed Aug. 31, 2007, titled "Variable ALC Threshold for any Desired Compression Curve," and U.S. Provisional Patent Application No. 60/970,283, filed Sep. 6, 2007, titled "Variable ALC Threshold for any Desired Compression Curve," the entire contents of which are hereby incorporated by reference herein, for all purposes.

TECHNICAL FIELD

The present invention relates to automatic level control (ALC) circuits and, more particularly, to ALC circuits that automatically generate threshold signals that vary as a function of an amplifier gain control signal.

BACKGROUND ART

An automatic limit control (ALC), sometimes referred to as an automatic level control, circuit is used to dynamically adjust the level of a signal to avoid problems associated with clipped peaks, introduced noise, etc., due to large changes in the amplitude (commonly referred to as the "dynamic range") of the signal. For example, loudspeakers in most notebook computers and cellular telephones have fairly limited dynamic ranges. The dynamic ranges of operating system alerts, such as "beeps," and of conventional ring tones are sufficiently limited that a user may set a fairly high volume level, without risking distortion caused by clipping of peaks in the sound signals.

However, audio and video soundtracks typically have relatively wide dynamic ranges. Thus, users who play DVDs, etc. on their notebook computers or music on their cell phones may find themselves increasing the volume in order to be able to hear relatively quiet dialog or music, and decreasing the volume to avoid distortion during loud passages or sound effects.

Similarly, while using a public address system or a cell phone, a user may hold a microphone too close or too far from his or her mouth, speak in an uneven voice or change the distance to the microphone while he or she speaks. Such behaviors may cause the audio signal to become very loud, and possibly distorted, or become too soft, or fade in and out.

To avoid noise and distortion, and to reduce unnatural and annoying variations in audio signal levels, many systems use conditioning circuits to compress the dynamic range of the audio signals, such that faint signals are boosted, and loud signals are boosted by a lesser amount or are attenuated. Such signal conditioning improves the perceived quality or clarity of the signal.

The amount of compression in the conditioning circuit is typically expressed by a compression ratio r, which is a ratio of the change in amplitude of an input signal compared to the amplitude change of the amplitude of an output signal. At one extreme, a compression ratio of 1:1 produces no compression, i.e., the circuit provides fixed gain. At another extreme (such as a compression ratio of about 20:1 or more), the output is held relatively constant regardless of the input level. The latter situation is commonly referred to as an "infinite compression ratio" or "limiting."

When a circuit's output signal level in decibels (dB) is plotted versus the input signal level in dB, the circuit's compression curve is generally a straight line whose slope (or the inverse of the slope) is equal to the compression ratio. If the compression ratio can be varied, the lines for different ratios generally intersect at a fixed reference point, called a rotation point. At the rotation point, the circuit's gain is the same for all of its available compression ratios.

At an infinite compression ratio, variations in the output audio signal that would otherwise result from clipped peaks or an improper use of a microphone are eliminated. However, the natural dynamic range of speech, music or other signal is also lost. In general, if the compression ratio is too large, the output signal amplitude is flat, and very low noise signals are amplified. On the other hand, if the compression ratio is too small, the microphone input problems remain, and the output may saturate and large signals may be clipped. The best perceived audio quality is usually achieved using a compression ratio of between about 2:1 and about 10:1.

A circuit may automatically respond to an output signal level to achieve a desired compression ratio. For example, a circuit may include an amplifier whose gain is automatically controlled in response to an output signal level. Such a circuit is disclosed in U.S. Pat. No. 5,631,968, titled "Signal Conditioning Circuit for Compressing Audio Signals" by Douglas R. Frey, et al., which is assigned to the assignee of the present invention. According to the above-referenced patent, a signal conditioning circuit may compress an audio signal by producing a gain control signal that is a function of the time-averaged audio signal and a fixed desired compression ratio, and amplifying the audio signal by an exponential function of the gain control signal.

Circuits, such as a dynamic range processor/dual VCA (voltage controlled amplifier) available from Analog Devices, Inc., Norwood Mass. as part number SSM2120, implement the signal conditioning circuit disclosed in the above-referenced patent. However, further improvements in the perceived quality of audio and other signals having large dynamic ranges are desirable.

SUMMARY OF THE INVENTION

An embodiment of the present invention provides a variable automatic level controller. The controller includes an amplifier configured to amplify an input signal by a gain, based on a gain control signal. The amplifier produces an output signal. A comparator circuit is coupled to the amplifier so as to receive a level signal representing an average of the input signal or an average of the output signal of the amplifier. The comparator circuit is also coupled to receive a threshold signal that varies as a function of the gain control signal. The comparator is configured to provide the gain control signal, such that if the level signal exceeds the threshold signal, the gain control signal is adjusted to decrease the gain of the amplifier. The comparator is further configured to provide the gain control signal, such that if the threshold signal exceeds the level signal, the gain control signal is adjusted to increase the gain of the amplifier.

The comparator circuit may include a comparator having inputs coupled to receive the level signal and the threshold signal, respectively. The comparator may have an output. The comparator circuit may also include control logic coupled to the comparator. The control logic may be configured to produce the gain control signal, based on the output of the comparator. Optionally or alternatively, the comparator may include a differential-input operational amplifier and/or digital logic.

The function of the gain control signal, according to which the threshold signal varies, may be such that, in a first range of level signals, the threshold signal changes by a first predetermined amount in response to a predetermined change in the level signal. Furthermore, in a second range of level signals, the threshold signal may change by a second predetermined amount, different than the first predetermined amount, in response to the predetermined change in the level signal. The function of the gain control signal may be such that, in a third range of level signals, the threshold signal changes by a third predetermined amount, different than the first and the second predetermined amounts, in response to the predetermined change in the level signal.

The function of the gain control signal may include a first function when the level signal is within a first range and a second function, different than the first function, when the level signal is within a second range. The function of the gain control signal may include a third function, different than the first function and the second function, when the level signal is within a third range.

The variable automatic level controller may also include a threshold signal generator configured to generate the threshold signal as the function of the gain control signal. The threshold signal generator may include a current source in series with an attenuator. The current source may be controlled by a signal based on the gain control signal. Optionally or alternatively, the threshold signal generator may include a plurality of switches controlled by a signal based on the gain control signal and electrically connected to a plurality of attenuators. The plurality of switches may include a plurality of solid-state devices and/or a plurality of microelectromechanical systems (MEMS) switches.

The threshold signal generator may include combinatorial logic, an operational amplifier and/or a comparator.

Another embodiment of the present invention provides a method for generating a gain control signal for an amplifier that is configured to amplify an input signal by a gain, based on the gain control signal. The amplifier produces an output signal. A level signal representing an average of the input signal or an average of the output signal of the amplifier is generated. A threshold signal that varies as a function of the gain control signal is generated. Based on the level signal and the threshold signal, the gain control signal is generated, such that if the level signal exceeds the threshold signal, the gain control signal is adjusted to decrease the gain of the amplifier. If the threshold signal exceeds the level signal, the gain control signal is adjusted to increase the gain of the amplifier. Optionally, the amplifier may be provided.

BRIEF DESCRIPTION OF THE DRAWINGS

The invention will be more fully understood by referring to the following Detailed Description of Specific Embodiments in conjunction with the Drawings, of which.

DETAILED DESCRIPTION OF SPECIFIC EMBODIMENTS

As used in this description and in any accompanying claims, the following terms shall have the meanings indicated, unless the context otherwise requires or indicates.

Amplifier—a circuit that receives an input signal and generates a reproduction of essential features of the input signal as an output signal; the output signal may have a greater, lesser or the same voltage, current, power or other measure of magnitude (collectively referred to herein as "power") as the input signal; the input and output signal may be analog or digital; digital signals contain digital information, such as time spaced-apart samples of a waveform's amplitude, from which an analog waveform may be generated.

Gain—an extent to which an amplifier boosts strength of an input signal when the amplifier produces an output signal; typically measured in decibels (dB), a logarithmic unit; an output power greater than the input power is indicated by a positive gain, and an output power less than the input power is indicated by a negative gain.

In accordance with preferred embodiments of the present invention, methods and apparatus are disclosed for conditioning a signal to dynamically adjust a compression ratio, so as to compress the signal and avoid limiting to the extent possible, thereby avoiding distorting the signal by clipping. Exemplary circuits generate a threshold signal used to establish a compression ratio, such that the threshold signal varies as a function of a gain control signal.

Figure 1:
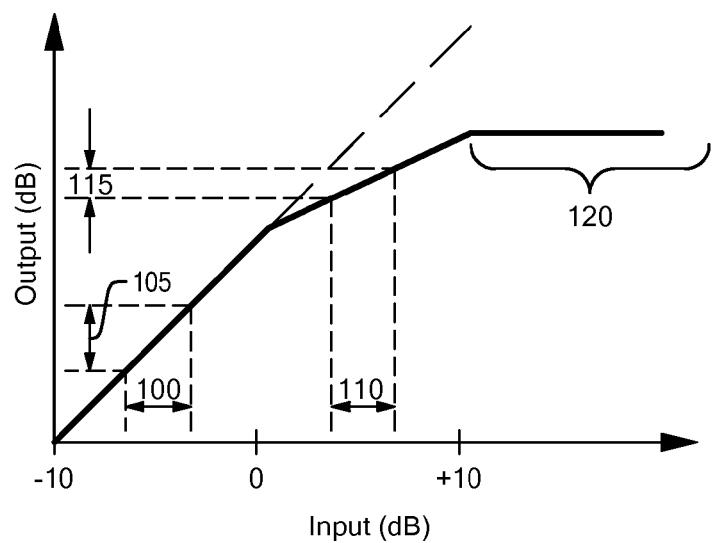
FIG. 1 contains a graph that illustrates compression ratios for a prior art compression circuit.

FIG. 1 contains a graph that illustrates compression ratios for a prior art compression circuit. As the level of an input signal increases from −10 dB to 0 dB (for example), the circuit provides a fixed gain. Thus, for a given change 100 in the input signal level, the circuit provides an equal change 105 in the output level, yielding a compression ratio of 1:1. However, if the signal level exceeds a threshold, the circuit decreases the gain, such that for a given change 110 in the input signal level, the circuit provides only half as much change 115 in the output signal, yielding a compression ratio of 2:1. Above a yet higher threshold (such as +10 dB of input), the circuit may provide no further increase in output level, thereby limiting the signal, as exemplified by the portion of the graph indicated at 120.

Figure 2:
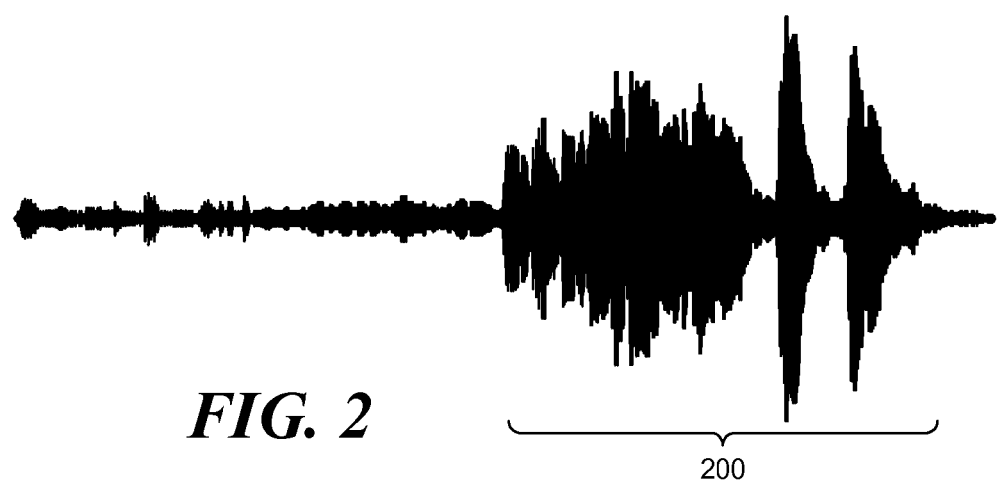
FIG. 2 illustrates compression of a signal.
Figure 3:
FIG. 3 illustrates limiting of the same signal as in FIG. 2.

Limiting can, however, lead to "flat" and unnatural audio reproduction. For example, as shown in FIG. 2, an audio signal may include a portion 200 containing widely varying signal levels. FIG. 3 shows an output from a conventional compressor/limiter circuit that receives the input signal of FIG. 2. The dynamic variations in the portion 200 of the input signal are largely evened out, yielding a less natural sounding signal.

Figure 4:
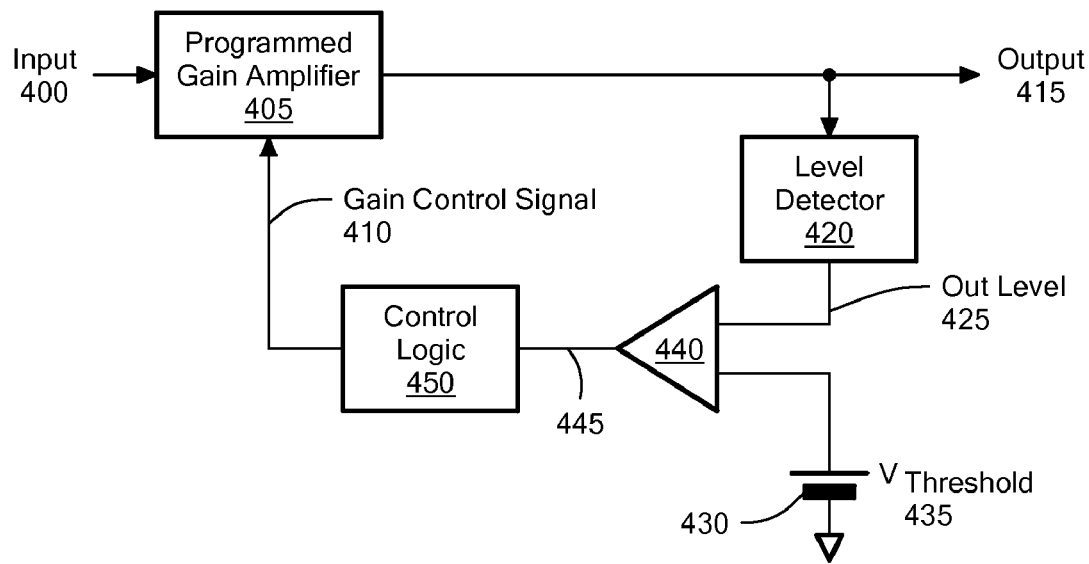
FIG. 4 is a schematic block diagram of a prior art signal conditioning circuit.

FIG. 4 is a schematic block diagram of a prior art signal conditioning circuit. An input signal 400 is applied to the input of a programmed gain amplifier (PGA) 405, whose gain can be controlled by a gain control signal 410. The output 415 of the PGA 405 is sampled by a level detector 420 to produce a signal (OutLevel) 425 that represents the level of the output signal 415. The level of the output signal 415 may be represented as a root mean squared (RMS) value, a peak value or using another suitable measure. A voltage source 430 produces a signal VThreshold 435 that represents a desired compression ratio. A comparator 440 compares the OutLevel signal 425 to the VThreshold signal 435 to produce a difference signal 445.

Control logic 450 generates the gain control signal 410 from the difference signal 445, such that the desired compression ratio is maintained. When the OutLevel signal 425 exceeds the VThreshold signal 435, the control logic 450 alters the gain control signal 410 to reduce the gain of the PGA 405. For example, the gain may be reduced by a step, such as 1 dB. When the OutLevel signal 425 is less than the VThreshold signal 435, the control logic 450 alters the gain control signal 410 to increase the gain of the PGA 405, such as by a 1 dB step.

Conventional compression circuits typically process analog signals in the log domain. Bipolar transistors are well suited for circuits that perform log-domain processing, because bipolar transistors exhibit an exponential relationship between collector current and base-to-emitter voltage that is very accurate over a wide range of currents. Thus, bipolar transistor-based circuits are well suited for implementing signal conditioners that handle analog signals according to mathematical models for compression.

On the other hand, CMOS-based semiconductor devices are favored over bipolar devices in many contexts, because analog and digital electronics can be combined on a single monolithic CMOS-based substrate, whereas bipolar-based technologies are not conducive to such combinations. Log-domain processing is, however, difficult to achieve in CMOS semiconductors, because CMOS-based semiconductors do not exhibit the exponential relationship described above. Thus, CMOS-based signal conditioning circuits can not provide compression without complex additional digital signal processing circuitry. Limiting does not require log-domain processing. Thus, CMOS-based signal condition circuits, such as the circuit exemplified by FIG. 4, typically provide only limiting.

Figure 5:
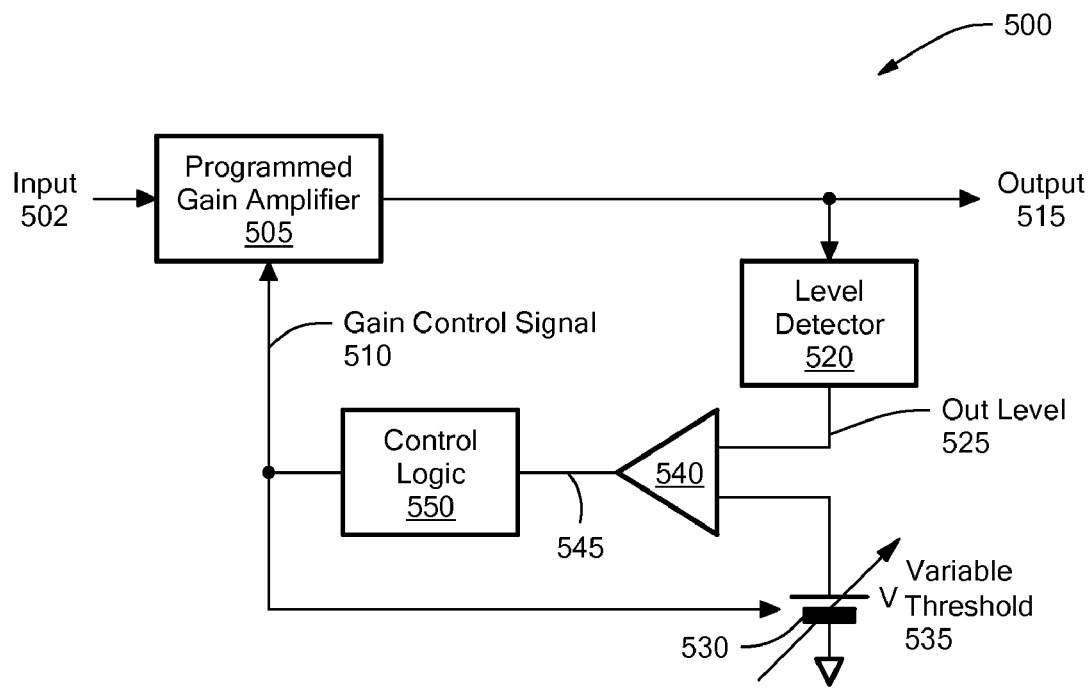
FIG. 5 is a schematic block diagram of a signal conditioning circuit, according to one embodiment of the present invention.

CMOS-based embodiments of the present invention can, however, perform compression, without complex digital signal processing. FIG. 5 is a schematic block diagram of a signal conditioning circuit 500, according to one embodiment of the present invention. An input signal 502 is applied to the input of a programmed gain amplifier (PGA) 505 or other amplifier whose gain can be controlled by a gain control signal 510 (collectively "PGA"). The output 515 of the PGA 505 is sampled by a level detector 520 to produce a signal (OutLevel) 525 that represents the level of the output signal 515. The level detector 520 may be an AC-level-to-DC-level converter or level detector, such as a rectifier. The OutLevel signal 525 may be, for example, a slowly varying DC voltage that represents a time-average of the level of the output signal 515.

Unlike the circuit shown in FIG. 4, however, a variable source 530 produces a variable VThreshold signal 535. A comparator 540 compares the OutLevel signal 525 to the variable VThreshold signal 535 to produce a difference signal 545. The comparator 540 may include a differential-input operational amplifier and/or other analog circuits. Optionally or alternatively, the comparator 540 may include digital logic. Control logic 550 generates the gain control signal 510 from the difference signal 545.

As in the circuit shown in FIG. 4, when the OutLevel signal 525 exceeds the VThreshold signal 535, the control logic 550 alters the gain control signal 510 to reduce the gain of the PGA 505, and when the OutLevel signal 525 is less than the VThreshold signal 535, the control logic 550 alters the gain control signal 510 to increase the gain of the PGA 505. However, unlike the prior art, in the circuit shown in FIG. 5, the VThreshold signal 535 is varied. In one embodiment, the VThreshold signal 535 varies as a function of the gain control signal 510.

Figure 6:
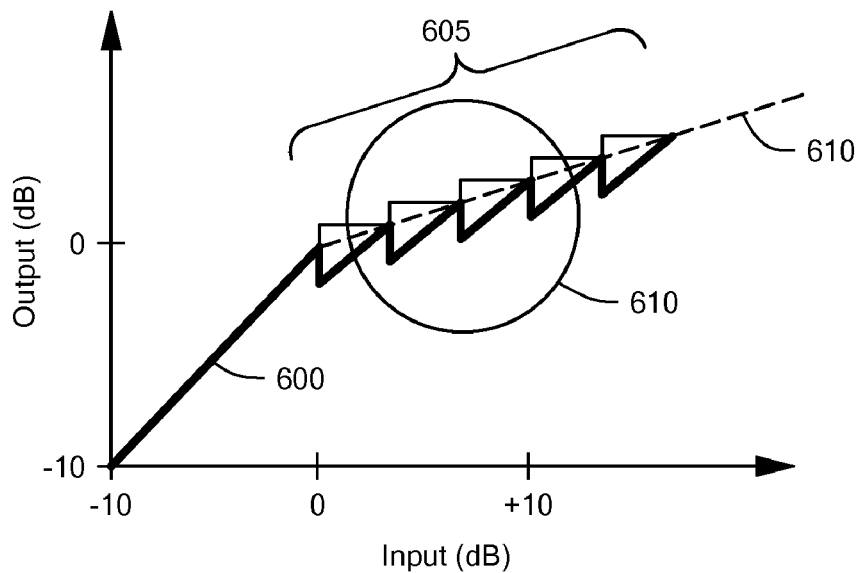
FIG. 6 is an exemplary graph showing a compression curve that characterizes one embodiment of the circuit of FIG. 5.

FIG. 6 is an exemplary graph showing a compression curve 600 that characterizes one embodiment of the circuit of FIG. 5. As the signal increases above a threshold (for example, 0 dB), the level detector 520 produces an OutLevel signal 525 that exceeds the VThreshold signal 535, consequently the control logic 550 reduces the gain of the PGA 505. As the input signal progressively increases and repeatedly exceeds the VThreshold signal 535, the control logic reduces the gain of the PGA 505 in steps, yielding a sawtooth-shaped portion 605 of the compression curve 600. Notably, the average slope of the sawtooth-shaped portion 605 (indicated by a dashed line 610) may be different than the slope of the portion of the curve 600 when the input signal is below 0 dB. Thus, the compression curve 600 exhibits two different compression ratios.

Figure 7:
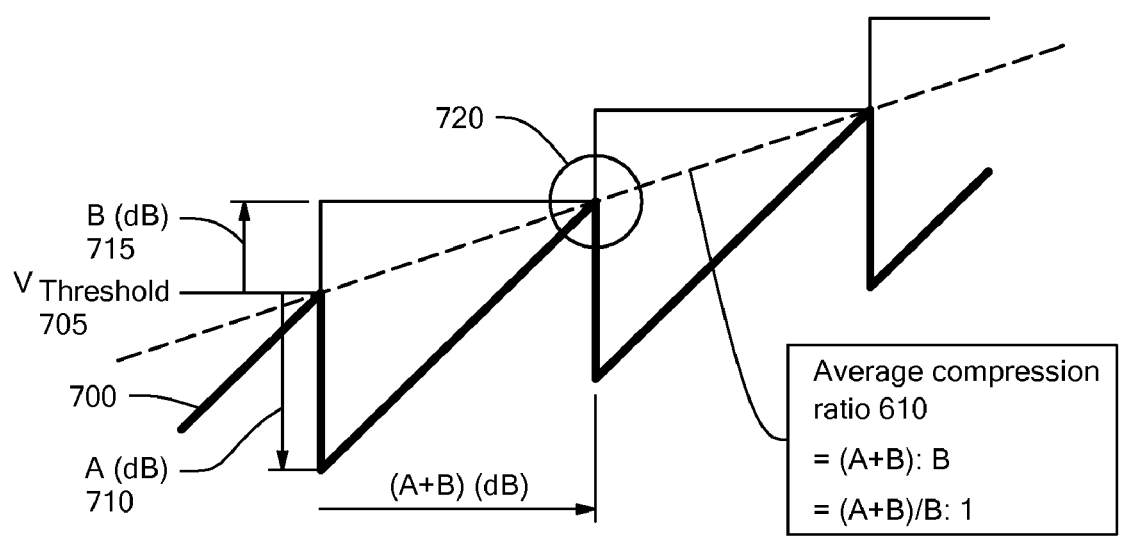
FIG. 7 is an enlargement of a portion of the graph of FIG. 6.

As noted, the VThreshold signal 535 varies, such as based on the gain control signal 510. Specifically, when the gain control signal 510 changes to increase the gain of the PGA 505, the VThreshold signal 535 is changed to more closely match a higher OutLevel signal 525, i.e., a higher output signal 515 level. For clarity, and to facilitate explaining how the VThreshold signal 535 is varied, a portion 615 of the graph of FIG. 6 is shown enlarged in FIG. 7. The compression curve of the circuit is represented by a thick line 700, and the VThreshold signal 535 is represented by a thin line 705.

As noted, as the level of the input signal 502 increases, the comparator 540 detects when the OutLevel signal 525 exceeds the VThreshold signal 535, and the control logic 550 changes the gain control signal 510 to decrease the gain of the PGA 505, such as by a step. Let "A" symbolically represent the size of the step decrease, measured in dB. This step decrease in gain of the PGA 505 is represented in the graph at 710.

In correspondence with the decrease 710 in gain of the PGA 505, the VThreshold signal 535 is increased by an amount symbolically represented by "B" dB 715. That is, VThreshold 530 is increased by an amount 715, such that an increase of B dB in the input signal would trigger a next reduction in gain of the PGA 505, i.e., if the input signal were to increase in level by B dB, the comparator 540 would detect that the OutLevel signal 525 once again exceeds (at the point indicated at 720) the now increased VThreshold signal 535. Consequently, a change of (A+B) dB in the input signal level causes a change of B dB in the output signal level. Thus, the compression ratio is (A+B):B or (A+B)/B:1. This average compression ratio 610 is provided throughout the sawtooth-shaped portion 605 of the compression curve.

Similarly, if the level of the input signal 502 decreases to a point where the comparator 540 detects that the OutLevel signal 525 is less than the VThreshold signal 535, the control logic 550 changes the gain control signal 510 to increase the gain of the PGA 505 by a step of size A dB. Correspondingly, VThreshold 530 is decreased by the amount 715, described above.

Figure 9:
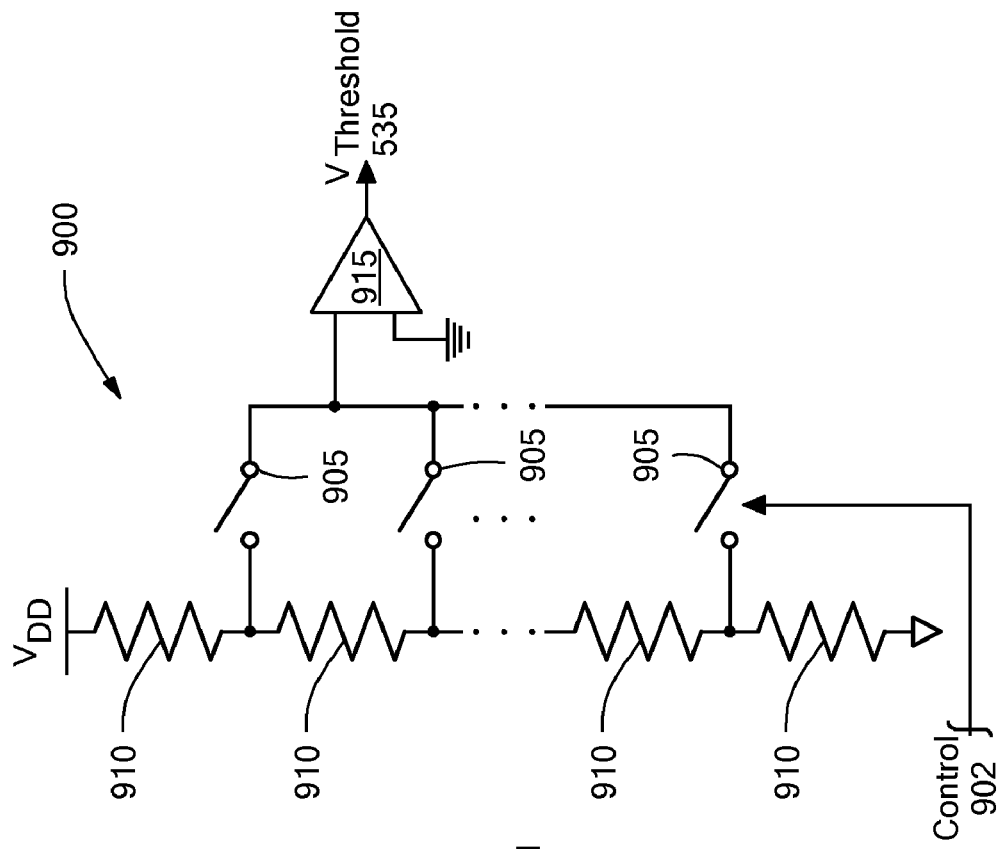
FIGS. 8 and 9 are schematic block diagrams of exemplary circuits for generating variable threshold signals, based on control signals, according to two embodiments of the present invention.
Figure 8:
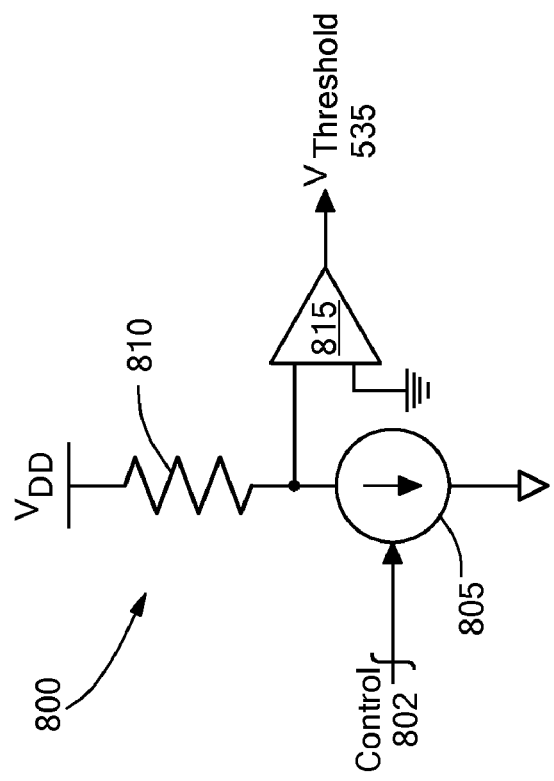

FIGS. 8 and 9 are schematic block diagrams of exemplary circuits 800 and 900 for generating the variable VThreshold signal 535, based on control signals 802 and 902, respectively. The control signals 802 and 902 may be multi-bit digital representations of the gain control signal 510 or another signal produced by the control logic 550 or another circuit. In the circuit shown in FIG. 8, the control signal 802 controls a current source 805 that produces a voltage drop across a resistor 810 to generate the VThreshold signal 535. In the circuit shown in FIG. 9, the control signal 902 controls an array of switches 905 that are connected to a ladder of resistors 910 connected to a voltage source VDD. The array of switches 905 may be implemented with solid-state devices (such as switching transistors), microelectromechanical systems (MEMS) switches or any other suitable switches. Optionally, an operational amplifier 815 or 915 may be included in the circuit.

The exemplary circuits 800 and 900 shown in FIGS. 8 and 9 produce analog signals, notably voltages. However, other types of circuits may be used to produce other types of signals, such analog currents or digital signals, that are functions of the gain control signal 510. Relatively simple circuits may be used to generate the VThreshold signal 535. Thus, CMOS-based embodiments of the present invention can provide signal compression, without complex signal processing circuitry. Designing other types of circuits for producing suitable variable voltage, or other types of, VThreshold signals 535 are within the capabilities of one of ordinary skill in the art, now that the present disclosure teaches how to utilize a variable threshold signal that is a function of a gain control signal in a signal conditioning circuit.

Figure 10:
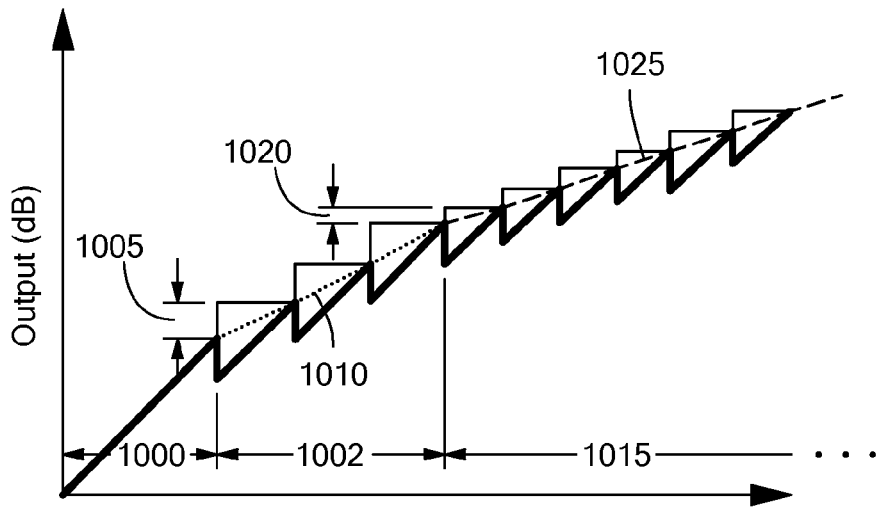
FIG. 10 is an exemplary graph showing a compression curve that characterizes another embodiment of the circuit of FIG. 5.

Although the compression curve 600 shown in FIG. 6 exhibits two different compression ratios, other VThreshold signal generator circuits may be configured to generate VThreshold signals 535, such that the resulting compression curve takes on any desired shape. For example, the VThreshold signal 535 may be increased or decreased by different amounts ("step sizes") in different portions of the compression curve to realize a compression curve with two "knees" and three different compression ratios, as shown in FIG. 10. A first portion 1000 of the compression curve exhibits a first compression ratio, such as 1:1. In a second portion 1002 of the compression curve, a step size 1005 may be selected to yield a second compression ratio (as indicated by the average slope of a dotted line 1010), and in a third portion 1015 of the compression curve, a smaller step size 1020 may be used to yield a higher compression ratio (as indicated by the average slope of a dashed line 1025). In the second portion 1002 of the compression curve, the compression ratio may be (for example) 2:1, whereas in the third portion 1015 of the compression curve, the compression ratio may be (for example) 3:1.

Thus, when the OutLevel signal 525 is within a first range, i.e., in the second portion 1002 of the compression curve, the VThreshold signal 535 varies as a first function of the gain control signal 510, and when the OutLevel signal 525 is within a second range of values, i.e., in the third portion 1015 of the compression curve, the VThreshold signal 535 varies as a second function, different than the first function, of the gain control signal 510. Other numbers of portions of the compression curve, each with a corresponding compression ratio and function of the gain control signal 510, may be used.

The circuit that generates the VThreshold signal 535 as a function of the gain control signal 510 may include passive components, as exemplified by the circuit of FIG. 9. Optionally or alternatively, the VThreshold signal generator circuit may include combinatorial logic, analog components (such as operational amplifier, comparators, etc.), processors or any other type of suitable circuit or combination thereof, based on the function(s) of the gain control signal 510 that are to be implemented.

The VThreshold signal generator may accept an analog or a digital representation of the gain control signal 510. Similarly, the VThreshold signal generator may generate an analog or a digital VThreshold signal 535. If a digital VThreshold signal 535 is generated, the comparator 540 should be a digital comparator, or the VThreshold signal 535 may be converted to an analog signal before being provided to an analog comparator. Similarly, the level detector 520 may generate an analog or a digital OutLevel signal 525, and the OutLevel signal 525 may be converted to an analog or to a digital signal, as needed by the comparator 540.

The signal conditioning circuit shown in FIG. 5 uses feedback from the output signal 515 to generate the gain control signal 510. Alternatively, a feedforward control mechanism may be used, as shown in the schematic block diagram of FIG. 11. Here, a level detector 1120 is coupled to sample the input signal 1102 to generate an InLevel signal 1125, similar to the way the OutLevel signal 525 is generated, as described above. A comparator 1140 compares the InLevel signal 1125 to a variable VThreshold signal 1135 from a VThreshold signal generator 1130 to generate a difference signal 1145. Control logic 1150 uses an output from the comparator 1140 to generate a gain control signal 1110, which controls the gain of a PGA 1105. As described above, the VThreshold signal generator 1130 generates the VThreshold signal 1135 as a function of the gain control signal 1110. The PGA 1105 amplifies the input signal 1102, by an amount that is controlled by the gain control signal 1110, to produce an output signal 1115.

Figure 11:
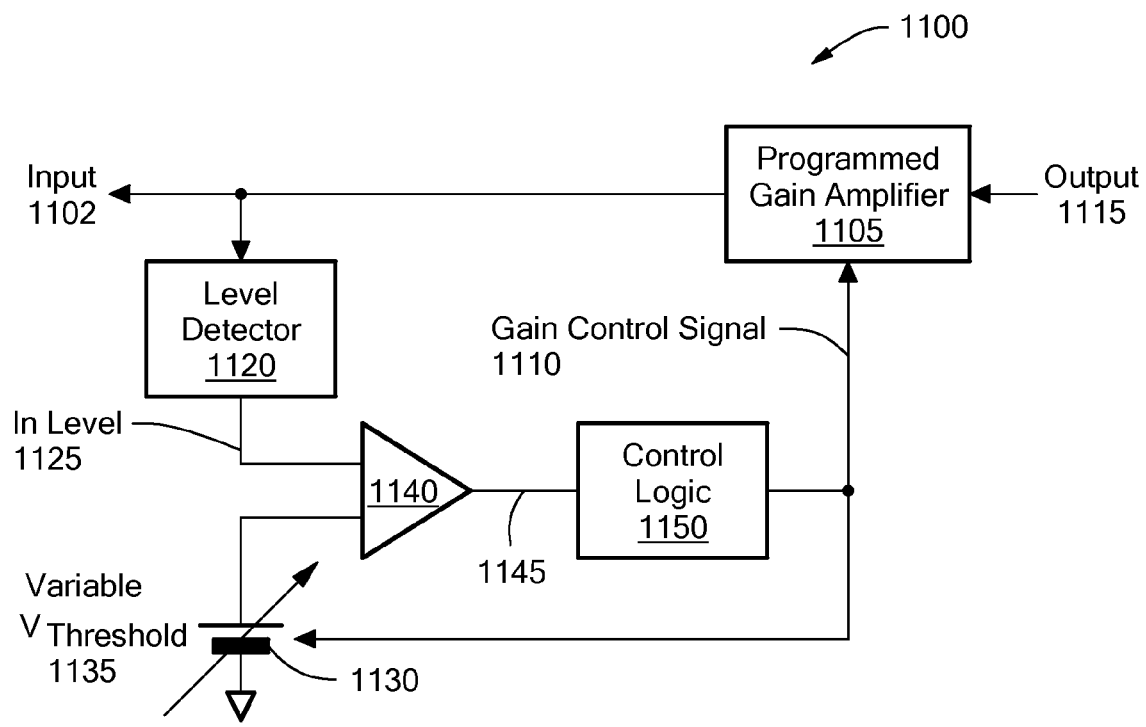
FIG. 11 is a schematic block diagram of a signal conditioning circuit, according to another embodiment of the present invention.
Figure 12:
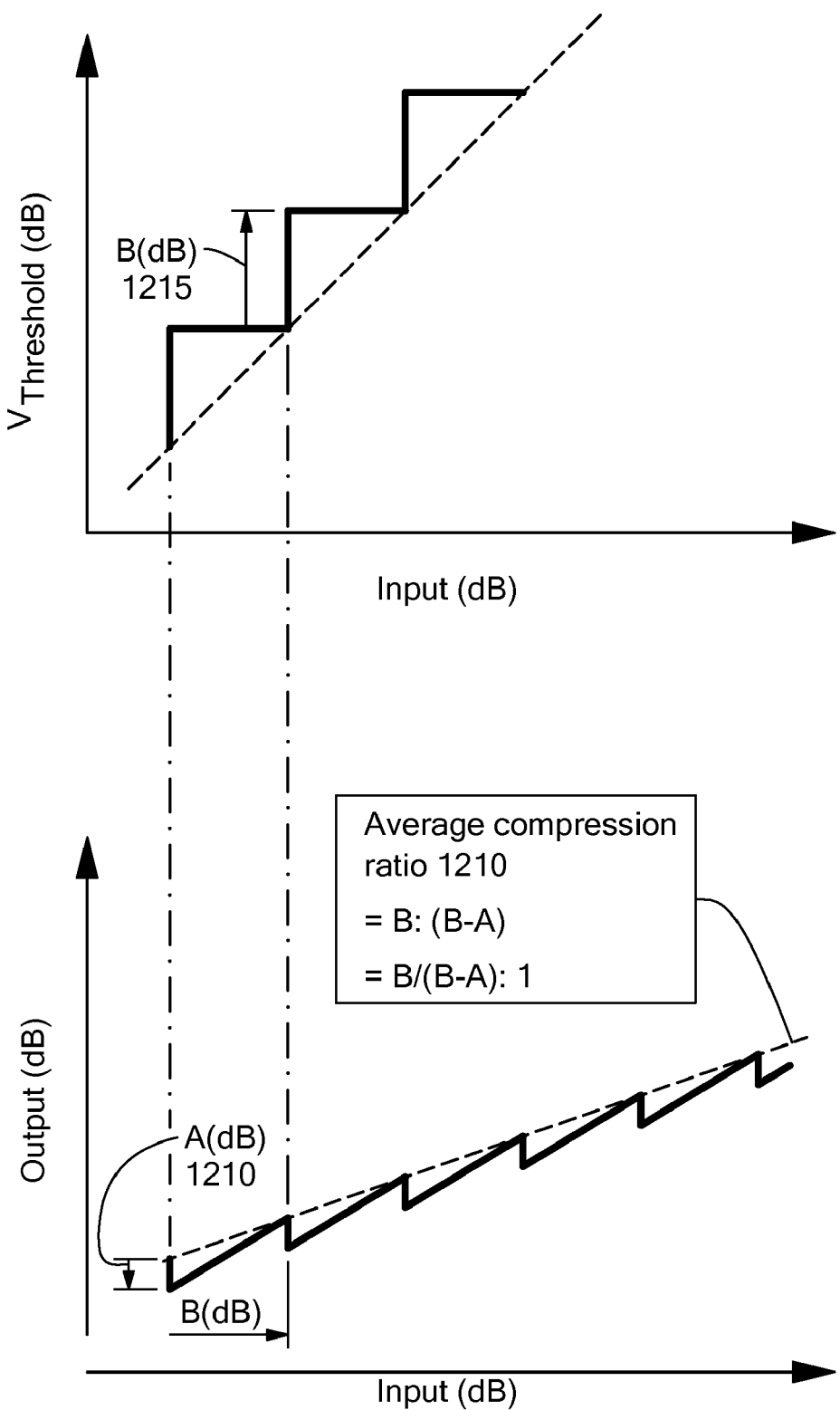
FIG. 12 contains two correlated graphs that illustrate operation of the circuit of FIG. 11.

FIG. 12 contains two correlated graphs that illustrate operation of the feedforward circuit 1100 of FIG. 11. As in the feedback circuit of FIG. 5, as the level of the input signal 1102 increases, the comparator 1140 detects when the InLevel signal 1125 exceeds the VThreshold signal 1135, and the control logic 1150 changes the gain control signal 1110 to decrease the gain of the PGA 1105, such as by a step of magnitude A. This step decrease in gain of the PGA 1105 is represented in the graph (FIG. 12) at 1210. In correspondence to the decrease 1210 in gain of the PGA 1105, the VThreshold signal 1135 is increased by an amount B dB, as indicated at 1215. Consequently, a change of B dB in the input signal level causes a change of (B−A) dB in the output signal level. Thus, the compression ratio is B:(B−A) or B/(B−A):1. This average compression ratio 1210 is provided throughout the sawtooth-shaped portion of the compression curve.

Embodiments of the signal conditioning circuits described above may be implemented in silicon-based or other types of semiconductors, such as integrated circuits. Optionally or alternatively, all or portions of the circuits may be implemented with discrete components and/or in software or firmware. Although exemplary circuits and graphs have been described in the context of conditioning audio signals, other types of signals, such as video, electrocardiogram (EKG) and radio frequency (RF) signals, may be conditioned using similar circuits. The signal conditioning circuits and methods described herein may be used to condition signals prior to further processing and/or amplification of the signals, such as by class D amplifiers.

Figure 13:
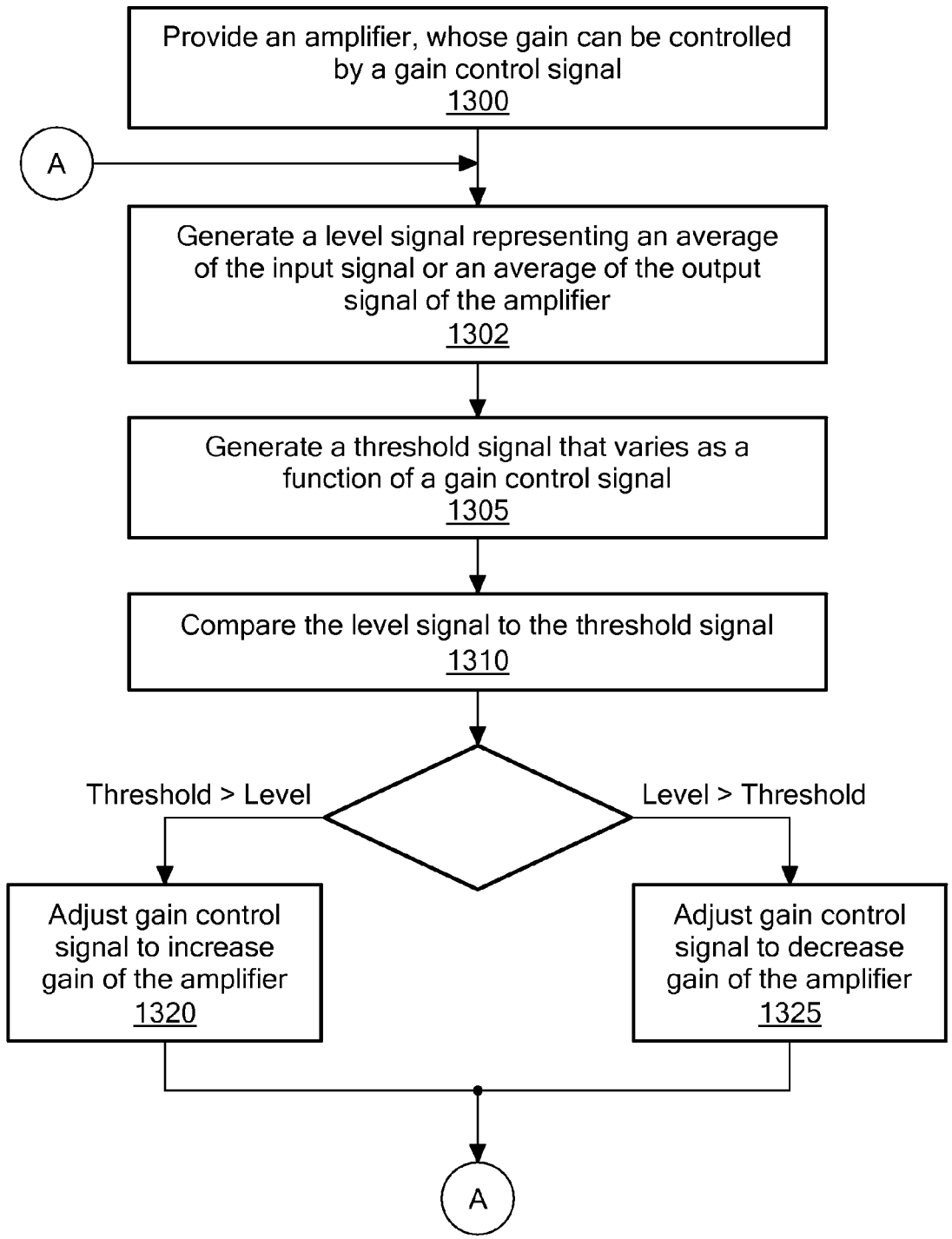
FIG. 13 is a flowchart illustrating operation of a signal conditioning circuit, according to an embodiment of the present invention.

FIG. 13 is a flowchart illustrating operation of a signal conditioning circuit, in accordance with an embodiment of the present invention. At 1300, an amplifier whose gain can be controlled by a gain control signal is provided. At 1302, a level signal is generated to represent an average of an input signal or an average of an output signal of an amplifier. At 1305, a threshold signal that varies as a function of a gain control signal is generated. At 1310, the level signal is compared to the threshold signal. If the level signal exceeds the threshold signal, at 1325, the gain control signal is generated, such that the gain of the amplifier is decreased. If the level signal exceeds the threshold signal, at 1320 the gain control signal is generated, such that the gain of the amplifier is increased. Control may return to 1302, and the process may be repeated.

While the invention may be embodied in a silicon-based or other semiconductor, the functions necessary to implement the invention may optionally or alternatively be embodied in part or in whole using software, firmware and/or hardware components, such as combinatorial logic, Application Specific Integrated Circuits (ASICs), Field-Programmable Gate Arrays (FPGAs) or other hardware or some combination of hardware, software and/or firmware components.

While the invention is described through the above-described exemplary embodiments, it will be understood by those of ordinary skill in the art that modifications to, and variations of, the illustrated embodiments may be made without departing from the inventive concepts disclosed herein. For example, although some aspects of a signal conditioning circuit have been described with reference to block diagrams and a flowchart, those skilled in the art should readily appreciate that functions, operations, decisions, etc. of all or a portion of each block, or a combination of blocks, of the block diagram and the flowchart may be combined, separated into separate operations or performed in other orders. Furthermore, disclosed aspects, or portions of these aspects, may be combined in ways not listed above. Accordingly, the invention should not be viewed as being limited to the disclosed embodiment(s).

What is claimed is:

1. A variable automatic level controller, comprising:
   an amplifier configured to amplify an input signal by a gain, based on a digital gain control signal, to produce an output signal; and
   a comparator circuit coupled to the amplifier so as to receive:
      (a) a level signal representing an average of the input signal or an average of the output signal of the amplifier; and
      (b) a threshold signal that varies as a function of the digital gain control signal;
   wherein the comparator circuit is configured to provide the digital gain control signal such that:
      (a) if the level signal exceeds the threshold signal, the digital gain control signal is adjusted to decrease the gain of the amplifier; and
      (b) if the threshold signal exceeds the level signal, the digital gain control signal is adjusted to increase the gain of the amplifier.

2. A variable automatic level controller according to claim 1, wherein the comparator circuit comprises:
   a comparator having inputs coupled to receive the level signal and the threshold signal, respectively, the comparator having an output; and
   control logic coupled to the comparator and configured to produce the digital gain control signal based on the output of the comparator.

3. A variable automatic level controller according to claim 2, wherein the comparator comprises a differential-input operational amplifier.

4. A variable automatic level controller according to claim 2, wherein the comparator comprises digital logic.

5. A variable automatic level controller according to claim 1, wherein the function of the digital gain control signal is such that:
   in a first range of level signals, the threshold signal is changed by a first predetermined amount in response to a predetermined change in the level signal; and
   in a second range of level signals, the threshold signal is changed by a second predetermined amount, different than the first predetermined amount, in response to the predetermined change in the level signal.

6. A variable automatic level controller according to claim 5, wherein the function of the digital gain control signal is such that in a third range of level signals, the threshold signal is changed by a third predetermined amount, different than the first and the second predetermined amounts, in response to the predetermined change in the level signal.

7. A variable automatic level controller according to claim 1, wherein the function of the digital gain control signal comprises:
   a first function when the level signal is within a first range; and
   a second function, different than the first function, when the level signal is within a second range.

8. A variable automatic controller according to claim 7, wherein the function of the digital gain control signal further comprises:
   a third function, different than the first function and the second function, when the level signal is within a third range.

9. A variable automatic level controller according to claim 1, further comprising a threshold signal generator configured to generate the threshold signal as the function of the digital gain control signal, the threshold signal generator comprising a current source in series with an attenuator, wherein the current source is controlled by a signal based on the digital gain control signal.

10. A variable automatic level controller according to claim 1, further comprising a threshold signal generator configured to generate the threshold signal as the function of the digital gain control signal, the threshold signal generator comprising a plurality of switches controlled by a signal based on the digital gain control signal and electrically connected to a plurality of attenuators.

11. A variable automatic level controller according to claim 10, wherein the plurality of switches comprises a plurality of solid-state devices.

12. A variable automatic level controller according to claim 10, wherein the plurality of switches comprises a plurality of microelectromechanical systems (MEMS) switches.

13. A variable automatic level controller according to claim 1, further comprising a threshold signal generator configured to generate the threshold signal as the function of the digital gain control signal, the threshold signal generator comprising combinatorial logic.

14. A variable automatic level controller according to claim 1, further comprising a threshold signal generator configured to generate the threshold signal as the function of the digital gain control signal, the threshold signal generator comprising an operational amplifier.

15. A variable automatic level controller according to claim 1, further comprising a threshold signal generator configured to generate the threshold signal as the function of the digital gain control signal, the threshold signal generator comprising a comparator.

16. A method for generating a digital gain control signal for an amplifier configured to amplify an input signal by a gain, based on the digital gain control signal, to produce an output signal, comprising:
    generating a level signal representing an average of the input signal or an average of the output signal of the amplifier;
    generating a threshold signal that varies as a function of the digital gain control signal; and
    based on the level signal and the threshold signal, generating the digital gain control signal such that:
        (a) if the level signal exceeds the threshold signal, the digital gain control signal is adjusted to decrease the gain of the amplifier; and
        (b) if the threshold signal exceeds the level signal, the digital gain control signal is adjusted to increase the gain of the amplifier.

17. A method as recited in claim 16, further comprising providing the amplifier.

* * * * *